United States Patent
Okabe (10) Patent No.: US 6,814,572 B2
(45) Date of Patent: Nov. 9, 2004

(54) HEAT TREATING METHOD AND HEAT TREATING DEVICE

(75) Inventor: Tsuneyuki Okabe, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/473,249

(22) PCT Filed: Mar. 13, 2002

(86) PCT No.: PCT/JP02/02377

§ 371 (c)(1),
(2), (4) Date: Sep. 29, 2003

(87) PCT Pub. No.: WO02/082523

PCT Pub. Date: Oct. 17, 2002

(65) Prior Publication Data

US 2004/0115584 A1 Jun. 17, 2004

(30) Foreign Application Priority Data

Mar. 30, 2001 (JP) ........................................ 2001-098044

(51) Int. Cl.[7] .................................................. F27B 5/16
(52) U.S. Cl. ......................... 432/200; 438/758; 118/715
(58) Field of Search ................................ 432/9, 17, 18, 432/198, 200; 427/255.6; 438/758, 935; 118/20, 58, 715, 722

(56) References Cited

U.S. PATENT DOCUMENTS

| | | | | |
|---|---|---|---|---|
| 4,369,031 A | * | 1/1983 | Goldman et al. | ........... 432/198 |
| 5,750,436 A | * | 5/1998 | Yamaga et al. | ............. 438/558 |
| 5,920,797 A | * | 7/1999 | Ballance et al. | ............ 438/758 |
| 6,171,104 B1 | | 1/2001 | Saito et al. | |

FOREIGN PATENT DOCUMENTS

| | | |
|---|---|---|
| JP | 07-074104 | 3/1995 |
| JP | 2000-058543 | 2/2000 |

OTHER PUBLICATIONS

International Preliminary Examination Report (PCT/IPEA/409) (translated) issued for PCT/JP02/02377.
Notification of Transmittal of Copies of Translation of the International Preliminary Examination Report (PCT/IB/338) issued for PCT/JP02/02377.

* cited by examiner

Primary Examiner—Gregory Wilson
(74) Attorney, Agent, or Firm—Smith, Gambrell & Russell, LLP (57) ABSTRACT

A thermal processing unit of the present invention includes: a reaction container which an object to be processed is conveyed into and from; a process-gas introducing part for introducing a process gas into the reaction container; a replacement-gas introducing part for introducing a replacement gas into the reaction container, the replacement-gas introducing part being independent of the process-gas introducing part; and a discharging part for discharging a gas in the reaction container. A controlling part is connected to the process-gas introducing part, the replacement-gas introducing part and the discharging part. The controlling part is adapted to control the discharging part so as to lower a pressure in the reaction container lower than a pressure at a thermal process, then control the process-gas introducing part and the replacement-gas introducing part so as to stop introducing the process gas and introduce the replacement gas into the reaction container as well as control the discharging part so as to raise the pressure in the reaction container higher than the pressure at the thermal process, and then control the discharging part so as to lower the pressure in the reaction container lower than the pressure at the thermal process.

9 Claims, 10 Drawing Sheets

HEAT TREATING METHOD AND HEAT TREATING DEVICE

BACKGROUND OF THE INVENTION

1. Field of the Invention

The present invention relates to a thermal processing unit and a thermal processing method for carrying out a thermal process while supplying a process gas to an object to be processed.

2. Description of the Related Art

Figure 9:
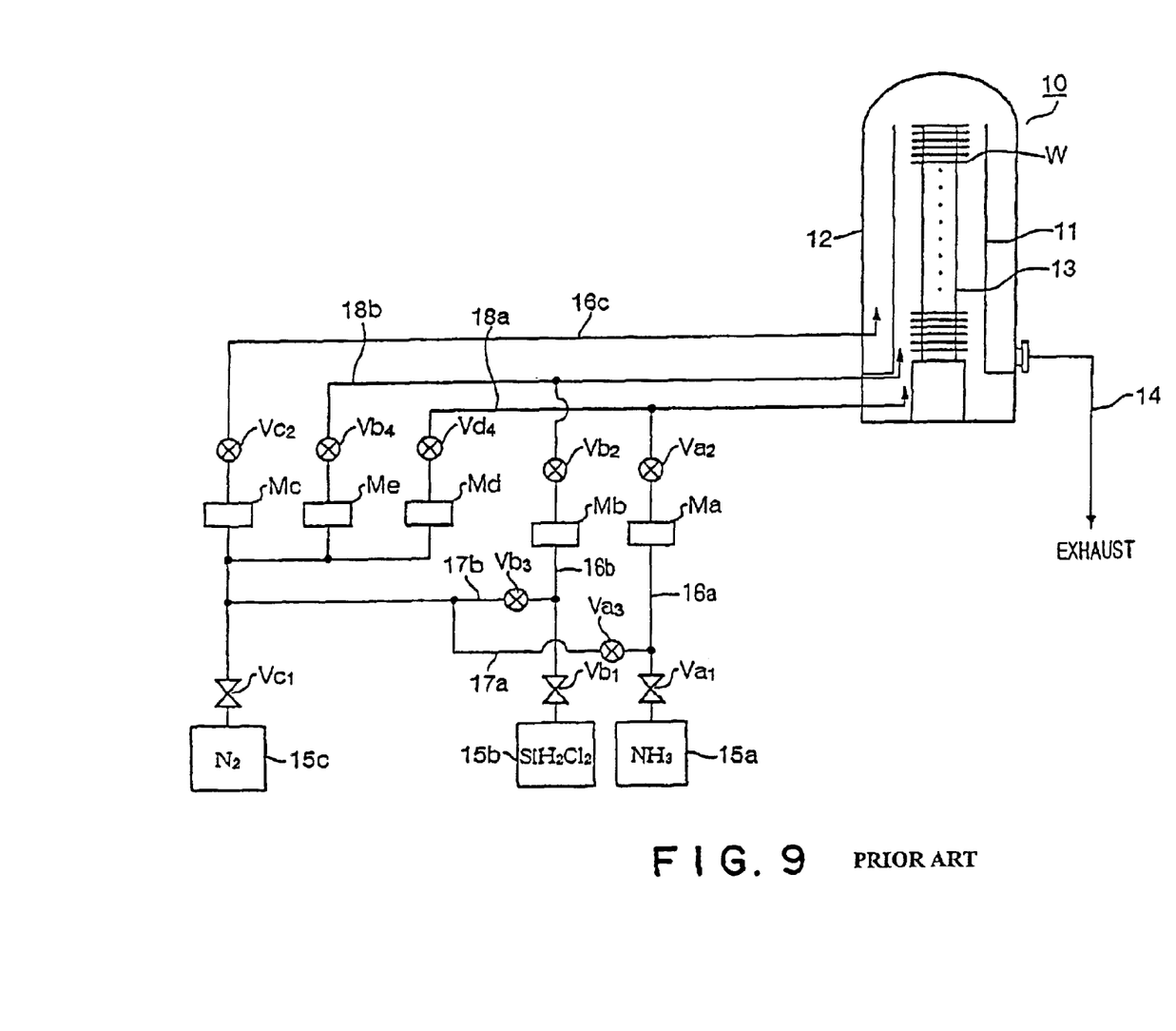
FIG. 9 is a schematic block diagram showing a thermal processing unit according to a conventional art.

There is a process to form a film on an object to be processed by a so-called reduced-pressure CVD (Chemical vapor deposition) method as one of manufacturing processes of a semiconductor device. A vertical thermal processing unit, as shown in FIG. 9, for example, is used as a unit for carrying out such a film-forming process. This vertical thermal processing unit conducts a thermal process to objects to be processed in a batch manner. Specifically, the vertical thermal processing unit is provided with a cylindrical reaction tube 10 consisting of quartz double tubes, an inner tube 11 and an outer tube 12. A wafer-boat 13 holding many semiconductor wafers (to be referred to as a wafer hereinafter) W, which are the objects to be processed, is conveyed from a lower side of the reaction tube 10 into the reaction tube 10. Inside of the reaction tube 10 is evacuated by a not-shown vacuum pump via a discharging tube 14 so as to be a reduced-pressure atmosphere. On the other hand, a process gas is introduced into the reaction tube 10. A not-shown heater surrounds a side circumference of the reaction tube 10. The film-forming process of the wafers W is carried out by heat generated by the heater.

When the film-forming process is a film-forming process of, for example, a silicon nitride film, ammonium ($NH_3$) gas and dichlorosilane ($SiH_2Cl_2$) gas, for example, are used as process gases. A gas-supplying system in this case will be briefly described. The ammonium gas is supplied from a gas supplying source 15a through a gas tube 16a and the dichlorosilane gas is supplied from a gas supplying source 15b through a gas tube 16b, into the reaction tube 10 respectively. Incidentally, in order to make a maintenance cycle of the outer tube 12 longer, nitrogen gas as a purge gas is adapted to be supplied from a gas supplying source 15c through a gas tube 16c into a room between the inner tube 11 and the outer tube 12. Vc1 and Vc2 indicate valves and Mc indicates a flow-rate adjusting part. In the gas tube 16a, a valve Va1, a flow-rate adjusting part Ma, and a valve Va2 are provided in this order from an upstream side thereof. In the gas tube 16b, a valve Vb1, a flow-rate adjusting part Mb and a valve Vb2 are provided as well.

By the way, the aforementioned process gases are poisonous. Therefore, when the processed wafers W are taken out from the reaction tube 10 immediately after the completion of the film-forming process, the poisonous process gases, which remain in the reaction tube 10 and the gas tubes 16a, 16b communicated thereto for supplying the process gases, may be flown to the outside. Therefore, the nitrogen gas is flown from the gas supplying source 15c to the gas tubes 16a, 16b as a replacement gas (purge gas) after the completion of the film-forming process, so that the remaining process gases can be replaced with the nitrogen gas.

Specifically, the gas tube 16c branches into four tubes, i.e. bypass ways 17a, 17b, 18a, 18b at an upstream portion with respect to the flow-rate adjusting part Mc. The bypass ways 17a and 18a are connected to an upstream side and a downstream side with respect to the flow-rate adjusting part Ma of the gas tube 16a, and the bypass ways 17b and 18b are connected to an upstream side and a downstream side with respect to the flow-rate adjusting part Mb of the gas tube 16b. A valve Va3 is provided with the bypass way 17a, a valve Vb3 is provided with the bypass way 17b, a flow-rate adjusting part Md and a valve Vd4 are provided with the bypass way 18a in this order from an upstream side thereof, and a flow-rate adjusting part Me and a valve Vb4 are provided with the bypass way 18b in this order from an upstream side thereof, respectively.

As described above, the nitrogen gas supply is conducted by two lines to each of the gas tubes 16a, 16b that are for supplying the process gases. This is because a flow-rate adjusting range of each of the process gases is narrow and a maximum flow rate of each of the flow-rate adjusting parts Ma, Mb is small. In other words, the bypass ways 18a, 18b are provided in order to ensure a flow rate of the nitrogen gas.

SUMMARY OF THE INVENTION

Figure 10:
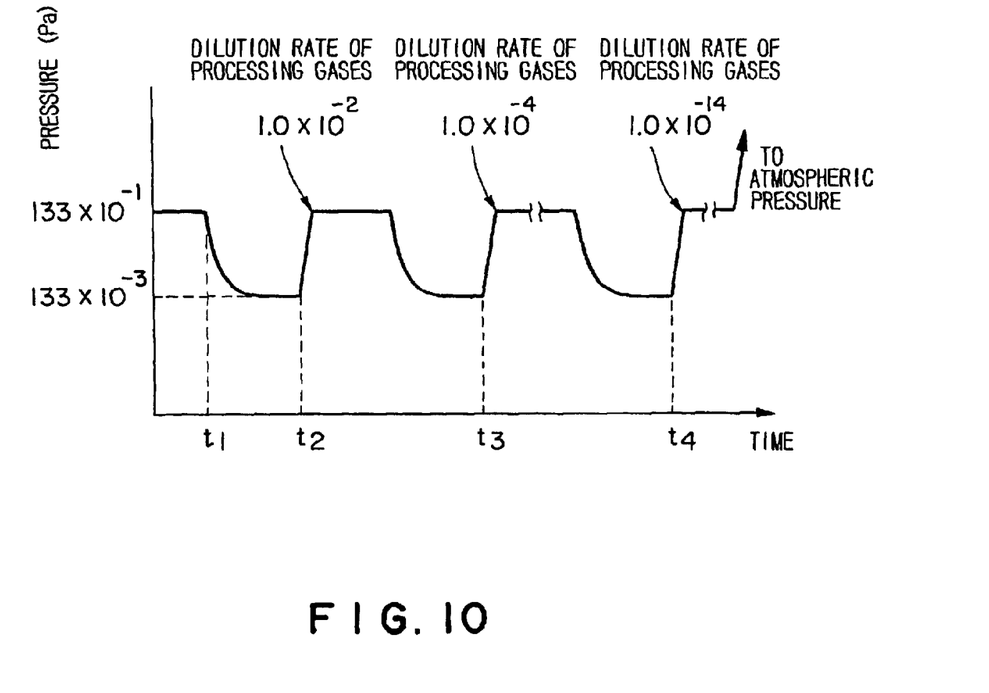
FIG. 10 is a specific chart for illustrating a process to discharge a process gas from a reaction container in the prior art.

The inventor has been studying a method, for example, illustrated in FIG. 10 as a method for removing a process gas. First of all, at a time t1 when a film-forming process is completed, all the gas supplies into the gas tubes 16a and 16b are stopped. Then, the process gas is discharged toward the discharging tube 14 so that the previous process pressure of 13.3 Pa (0.1 Torr) is reduced to 0.133 Pa. However, the rate for the process gas to be discharged gradually becomes slower. Therefore, in order to enhance a probability of collision of nitrogen gas molecules and process gas molecules by raising the pressure in the reaction tube 10 up to the previous process pressure once, the nitrogen gas supply to the gas tubes 16a and 16b are started (a time t2). This leads a dilution ratio of the process gases remaining in the reaction tube 10 to be lowered to $1.0 \times 10^{-2}$. Thereafter, the process gases are discharged toward the discharging tube 14 so as to reduce the pressure at a blast (a time t3). Then, when the nitrogen gas supply to the gas tubes 16a and 16b is started again (a time t4), the concentration of the remaining process gases becomes about $1.0 \times 10^{-4}$. By repeating such pressure-raising/lowering steps, the dilution ratio of the process gases in the reaction tube 10 is lowered to be not more than a safety standard value of, for example, $1.0 \times 10^{-14}$.

However, such a dilution process takes a long time, for example, about 30 minutes. This is because a power usage system is arranged at a position away from the thermal processing unit and a gas supplying unit is provided therein. In other words, since a crossover from the gas supplying unit to the thermal processing unit is long, it takes a long time to put out the process gases remaining in this part. Thereby, a period from the completion of the film-forming process of the wafers W to conveyance of the wafers W is long, which is one of causes of the low throughput.

This invention is based on the above issues and the object thereof is to provide a technique capable of shortening a required time from conveying-in of an object to be processed to conveying-out thereof in a thermal processing unit and a thermal processing method, in which a process gas is supplied to the object to be processed so as to conduct a thermal process.

The present invention is a thermal processing unit comprising: a reaction container which an object to be processed is conveyed into and from; a process-gas introducing part for introducing a process gas into the reaction container; a replacement-gas introducing part for introducing a replacement gas into the reaction container, the replacement-gas introducing part being independent of the process-gas introducing part; a discharging part for discharging a gas in the reaction container; and a controlling part connected to the process-gas introducing part, the replacement-gas introducing part and the discharging part, the controlling part being adapted to: control the discharging part so as to lower a pressure in the reaction container lower than a pressure at a thermal process, then control the process-gas introducing part and the replacement-gas introducing part so as to stop introducing the process gas and introduce the replacement gas into the reaction container as well as control the discharging part so as to raise the pressure in the reaction container higher than the pressure at the thermal process, and then control the discharging part so as to lower the pressure in the reaction container lower than the pressure at the thermal process.

According to the feature, it is possible to complete a gas replacement process of the reaction container within a short time, so that it is possible to immediately proceed to a conveying-out step of the object to be processed.

Preferably, the process-gas introducing part has a process-gas way for introducing the process gas into the reaction container and a first open-close unit arranged in a vicinity of the reaction container, the first open-close unit opening and closing the process-gas way, and the controlling part is adapted to control the first open-close unit.

In addition, preferably, the discharging part has a discharging way for discharging the gas in the reaction container and a pressure-adjusting unit arranged in the discharging way, the pressure-adjusting unit adjusting to open and close the discharging way so as to adjust the pressure in the reaction container, and the controlling part is adapted to control the pressure-adjusting unit.

In this case, it is preferable that the thermal processing unit further comprises a bypass way connected between an upstream portion with respect to the first open-close unit in the process-gas way and the discharging way, the bypass way bypassing the reaction container, and a second open-close unit that opens and closes the bypass way.

In this case, it is further preferable that an assistant replacement-gas introducing part for introducing the replacement gas into the processing-gas way is provided at an upstream portion with respect to a position connecting to the bypass way in the process-gas way.

Further preferably, the assistant replacement-gas introducing part has an assistant replacement-gas way for introducing the replacement gas into the process-gas way and a third open-close unit that opens and closes the assistant replacement-gas way.

Further preferably, the controlling part is connected to the second open-close unit and the third open-close unit, is adapted to control the first open-close unit and the third open-close unit to stop introducing the process gas and to introduce the replacement gas into the process-gas way so as to generate a pressure-raised state in the process-gas way, and then is adapted to control the second open-close unit so as to discharge the gas in the process-gas way through the bypass way.

According to the features, it is possible to carry out a gas replacement process in the process-gas way, for example while the object to be processed is conveyed into or from the reaction container. Therefore, the throughput is enhanced.

Moreover, the present invention is a thermal processing method for conducting a thermal process to an object to be processed by using a thermal processing unit comprising: a reaction container which an object to be processed is conveyed into and from; a process-gas introducing part for introducing a process gas into the reaction container; a replacement-gas introducing part for introducing a replacement gas into the reaction container, the replacement-gas introducing part being independent of the process-gas introducing part; and a discharging part for discharging a gas in the reaction container; the method comprising: a first pressure-lowering step of controlling the discharging part so as to lower a pressure in the reaction container lower than a pressure at thermal process, the first pressure-lowering step being conducted after completing the thermal process; a pressure-raising step of controlling the process-gas introducing part and the replacement-gas introducing part so as to stop introducing the process gas and introduce the replacement gas into the reaction container as well as controlling the discharging part so as to raise the pressure in the reaction container higher than the pressure at the thermal process, the pressure-raising step being conducted after the first pressure-lowering step; and a second pressure-lowering step of controlling the discharging part so as to lower the pressure in the reaction container lower than the pressure at the thermal process, the second pressure-lowering step being conducted after the pressure-raising step.

Furthermore, the present invention is a thermal processing method for conducting a thermal process to an object to be processed by using a thermal processing unit comprising: a reaction container which an object to be processed is conveyed into and from; a process-gas introducing part for introducing a process gas into the reaction container; a replacement-gas introducing part for introducing a replacement gas into the reaction container, the replacement-gas introducing part being independent of the process-gas introducing part; and a discharging part for discharging a gas in the reaction container; the process-gas introducing part having a process-gas way for introducing the process gas into the reaction container and a first open-close unit arranged in a vicinity of the reaction container, the first open-close unit opening and closing the process-gas way, the controlling part being adapted to control the first open-close unit, the discharging part having a discharging way for discharging the gas in the reaction container and a pressure-adjusting unit arranged in the discharging way, the pressure-adjusting unit adjusting to open and close the discharging way so as to adjust the pressure in the reaction container, the controlling part being adapted to control the pressure-adjusting unit, the thermal processing unit further comprising: a bypass way connected between an upstream portion with respect to the first open-close unit in the process-gas way and the discharging way, the bypass way bypassing the reaction container; and a second open-close unit that opens and closes the bypass way, an assistant replacement-gas introducing part for introducing the replacement gas into the processing-gas way being provided at an upstream portion with respect to a position connecting to the bypass way in the process-gas way, and the assistant replacement-gas introducing part having an assistant replacement-gas way for introducing the replacement gas into the process-gas way and a third open-close unit that opens and closes the assistant replacement-gas way, the method comprising: a pressure-raising step of controlling the first open-close unit and the third open-close unit so as to stop introducing the process gas and introduce the replacement gas into the process-gas way so as to generate a pressure-raised state in the process-gas way, and a step of controlling the second open-close unit to discharge the gas in the process-gas way through the bypass way, the step being conducted after the pressure-raising step.

DESCRIPTION OF THE PREFERRED EMBODIMENT

Figure 1:
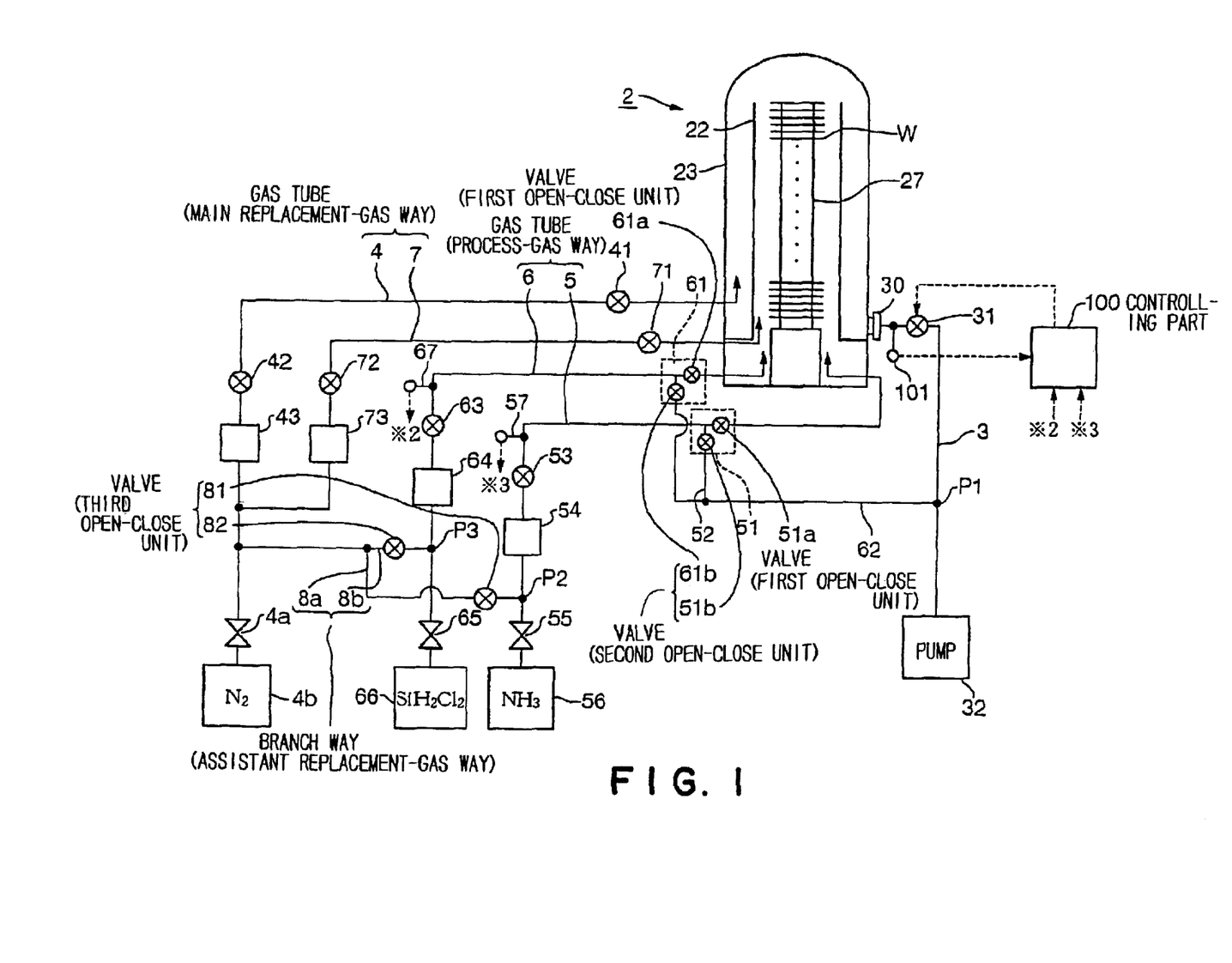
FIG. 1 is a schematic block diagram showing one embodiment of a thermal processing unit according to the present invention.
Figure 2:
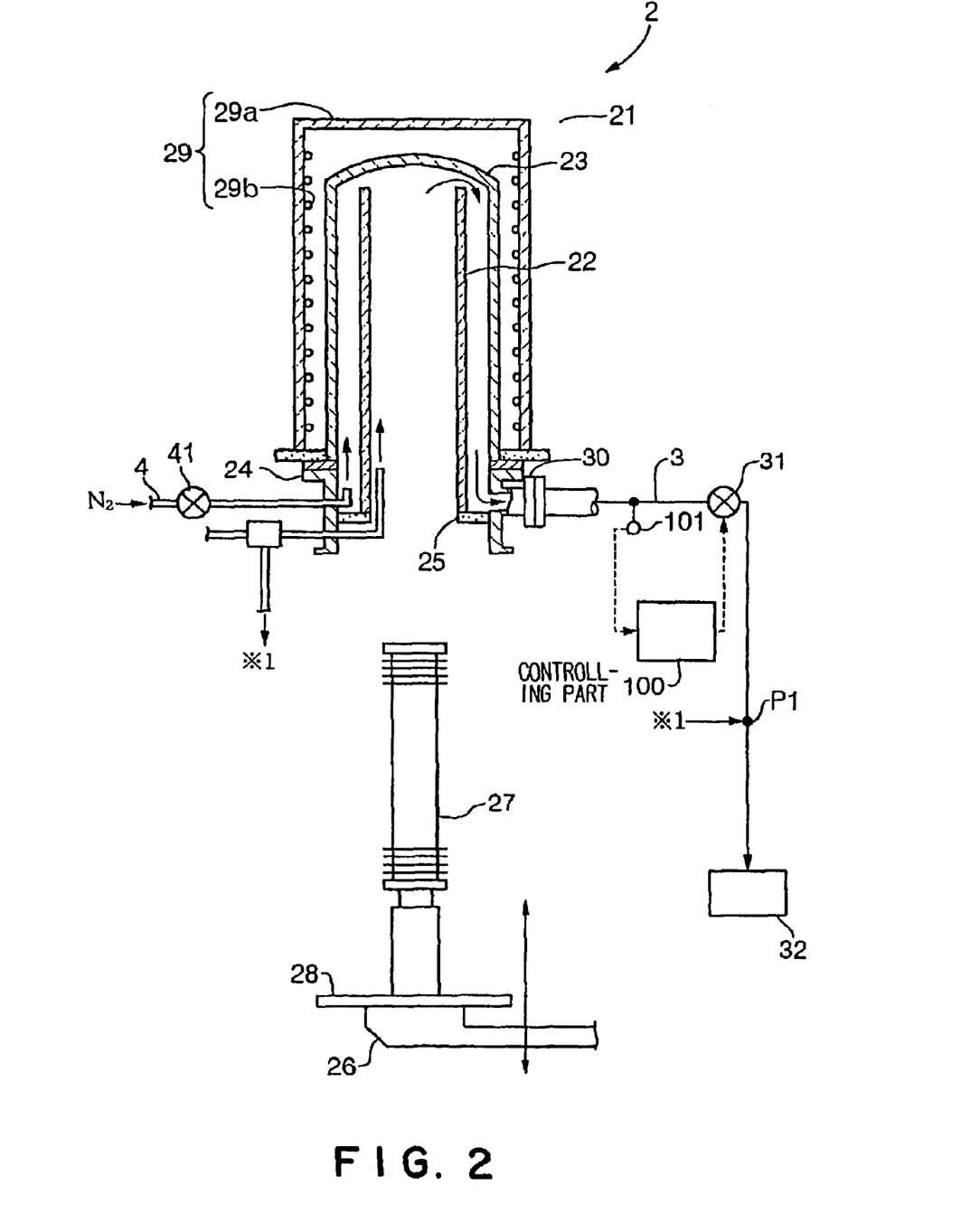
FIG. 2 is a vertical cross sectional view of a reaction container in FIG. 1.

FIG. 1 is a whole schematic view showing one embodiment of a thermal processing unit according to the present invention. A vertical thermal processing unit of this embodiment is provided with a reaction container 2. FIG. 2 is a vertical cross sectional view showing the reaction container 2. A reaction tube 21 shown in FIG. 2 is made of, for example, quartz. The reaction tube 21 has, for example, a double-tube structure consisting of an inner tube 22 and an outer tube 23. The outer tube 23 is provided coaxially with respect to the inner tube 22 so as to form an appropriate space. An upper end of the outer tube 23 is closed, and a lower end thereof is air-tightly connected to a cylindrical metallic manifold 24. On the other hand, an upper end of the inner tube 22 is opened. The inner tube 22 is supported by a supporting ring 25 formed to protrude from an inner peripheral face of the manifold 24.

Wafers W which are objects to be processed are placed on a wafer-boat (supporting member) 27 in a tier-like manner. A boat-elevator 26 is adapted to convey the wafer-boat (supporting member) 27 through an opening portion at a lower side of the manifold 24 into the inner tube 22. The inner tube 22 forms a thermal processing atmosphere for the wafers W, which are objects to be processed. The boat-elevator 26 is provided with a lid 28 capable of closing the opening portion at the lower side of the manifold 24. Additionally, a thermal insulator 29a is arranged so as to surround the circumference of the reaction tube 21. A heater 29b composed of, for example, a resistive heating element is provided on an inner wall face of the thermal insulator 29a. The thermal insulator 29a and the heater 29b form a heating furnace 29.

A plurality of gas introducing tubes (for convenience, only one of them is shown in the figure) for introducing a process gas, a replacement gas and the like into the reaction container 2 pierce through a lower part of the manifold 24 with respect to the supporting ring 25. In order to supply the gases along an inner face of the inner tube 22, tip portions of the gas introducing tubes are bent upward. In this embodiment, the gas introducing tubes correspond to gas tubes 5, 6 which are process gas ways and a gas tube 7 which is a replacement gas way. On the other hand, a discharging port 30 is formed at a circumferential face of an upper part of the manifold 24 with respect to the supporting ring 25. In addition, in order to prevent adhesion of a thin film onto the inner tube 22 and the outer tube 23, a gas tube 4 for introducing nitrogen gas pierces through an upper part of the manifold 24 with respect to the supporting ring 25.

A discharging tube 3 serving as a discharging way is hermetically connected to the discharging port 30. A vacuum pump 32 is connected to the discharging tube 3 through a pressure-adjusting unit 31. The pressure-adjusting unit 31 may be composed of an appropriate unit which adjusts an opening degree of the discharging tube 3. A controlling part 100 is adapted to control the pressure-adjusting unit 31, i.e. to adjust the opening degree of the discharging tube 3, depending on a measured pressure obtained by a pressure gauge 101, which measures the pressure inside the reaction container 2. Note that the controlling part 100 conducts not only control of the pressure-adjusting unit 31 but also control of all valves used in this embodiment.

Figure 3:
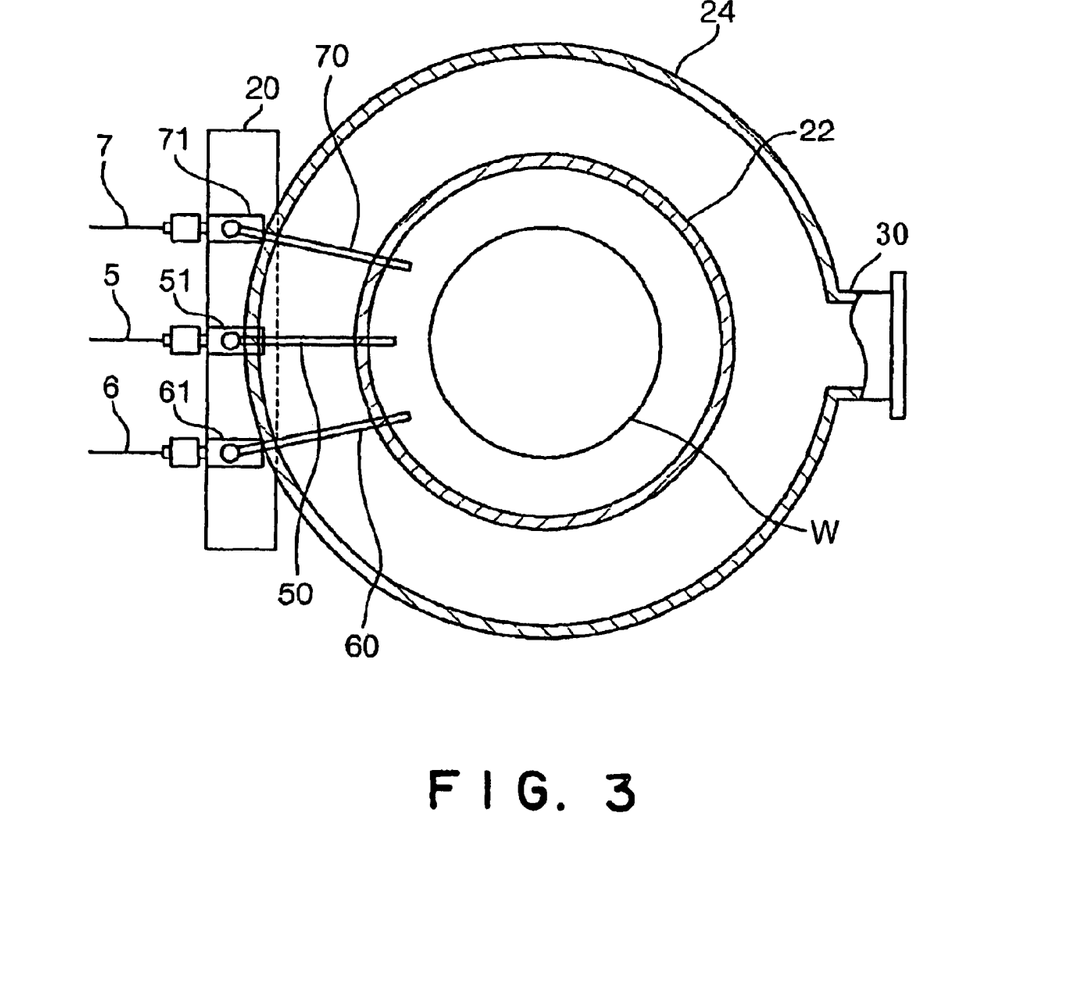
FIG. 3 is a transversal cross sectional view of the reaction container in FIG. 1.

Next, the plurality of gas introducing tubes for introducing the gases into the inner tube 22 will be described with reference to FIG. 3. For example, three gas introducing tubes are provided as shown in FIG. 3. Two of them are gas tubes 5, 6 serving as process gas ways, and one of them is a gas tube 7 serving as a replacement gas way. The gas tubes 5, 6 communicate with their tip portions 50, 60 via valve units 51, 61 provided in a vicinity of the reaction container 2, respectively. Each of the tip portions 50, 60 protrudes into the inside of the inner tube 22. The valve unit 51 is a combination of a valve 51a which serves as a first open-close unit and a valve 51b which serves as a second open-close unit, as shown in FIG. 1. As well, the valve unit 61 is also a combination of a valve 61a which serves as a first open-close unit and a valve 61b which serves as a second open-close unit.

The valves 51a, 61a are to open and close the gas tubes 5, 6, respectively. The valves 51b, 61b are respectively adapted to open and close bypass ways 52, 62, which are branched out from upstream portions with respect to the valves 51a, 61a of the gas tubes 5, 6 and are joined with (connected to) the discharging tube 3. Incidentally, the two bypass ways 52, 62 are joined together on their way (before being connected to the discharging tube 3), and are connected at a connection point P1 of the discharging tube 3.

Here, the gas tube 7 will be described with reference to FIG. 3. The gas tube 7 communicates with its tip portion 70 through a valve 71 provided in a vicinity of the reaction container 2. The tip portion 70 protrudes into the inside of the inner tube 22.

The valve units 51, 61 and the valve 71 are fixed to, for example, a common fixing member 20 provided in a vicinity of the reaction container 2. Besides the aforementioned gas tubes 4 to 7, the reaction container 2 may be provided with a cleaning-gas introducing tube for removing an adhesion which has adhered on the inner wall, and the like, which may also protrude into the inside of the inner tube 22, although they are not shown here.

By the way, there is a probability that particles in the reaction container 2 are stirred up by a pressure of the nitrogen gas when a large amount of the nitrogen gas is introduced from the gas tube 7 into the reaction container 2, for example after completion of a film-forming process.

Figure 4:
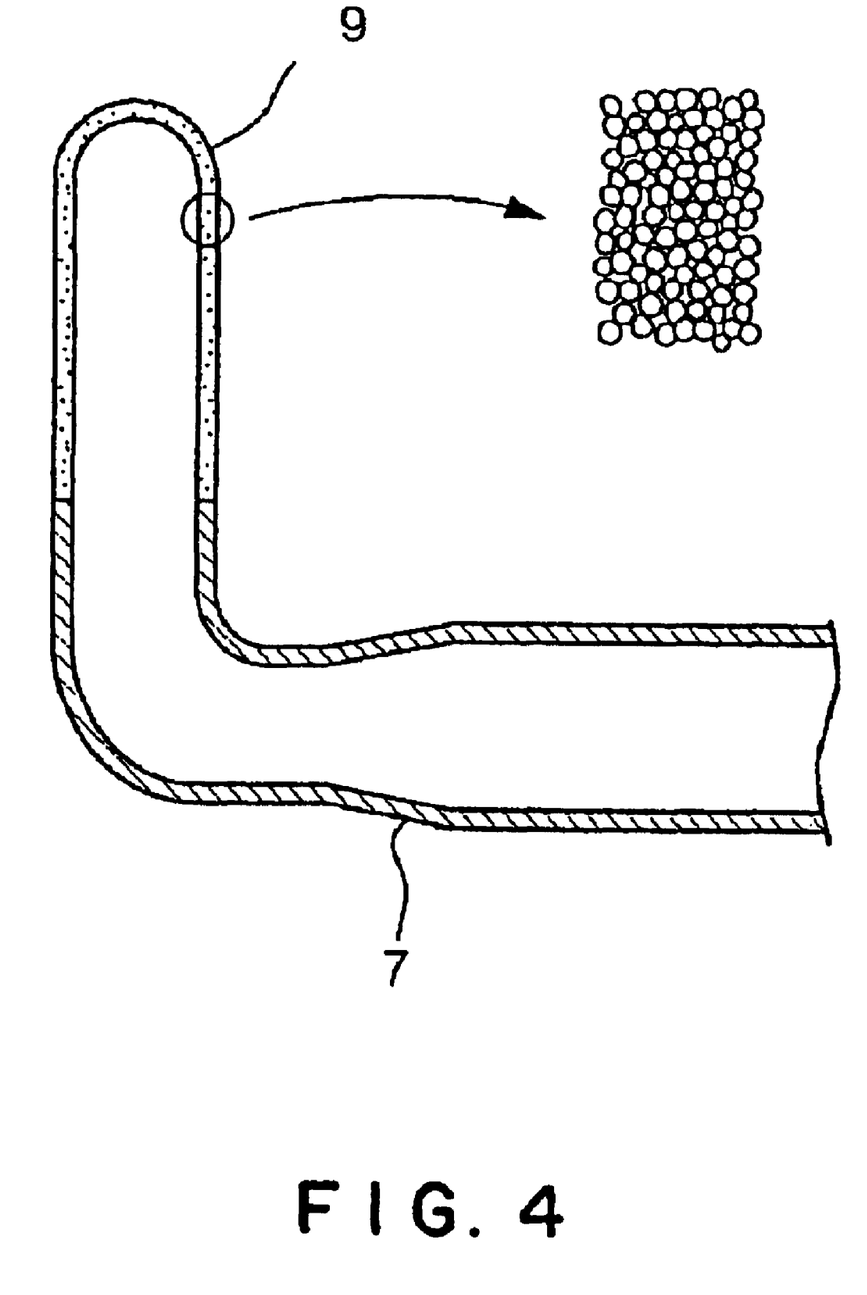
FIG. 4 is a vertical cross sectional view illustrating a tip portion of a gas tube for introducing nitrogen gas.

Accordingly, it is preferable that the tip of the gas tube 7 is covered with, for example, a ceramic porous layer, which is described in Japanese Patent Laid-Open Publication (Kokai) 2000-58530. The ceramic porous layer is, for example, a silica porous layer 9 as shown in FIG. 4. As shown in FIG. 4, this silica porous layer 9 has a cylindrical structure whose upper end is closed, and is fixed to the tip of the gas tube 7 by welding. A thickness of the silica porous layer 9 is, for example, 10 to 50 mm.

Next, with reference to FIG. 1, a structure at a base side of the aforementioned tube system i.e. the gas tubes 4, 5, 6, 7 is explained. The gas tube 4 and the gas tube 7 are both provided for supplying the nitrogen gas into the reaction container 2. Therefore, the base sides of the gas tubes 4 and 7 are commonly connected to a nitrogen gas supplying source 4b through a valve 4a. A valve 42 and a flow-rate adjusting part 43 are further provided between the valve 4a and the valve 41 in the gas tube 4. In addition, a valve 72 and a flow-rate adjusting part 73 are also provided between the valve 4a and the valve 71 in the gas tube 7.

A gas tube 5 is to supply, for example, ammonium ($NH_3$) gas and a gas tube 6 is to supply dichlorosilane ($SiH_2Cl_2$) gas. A base side of the gas tube 5 with respect to the valve unit 51 is connected to a gas supplying source 56 of the ammonium gas thorough a valve 53, a flow-rate adjusting part 54, and a valve 55. A base side of the gas tube 6 with respect to the valve unit 61 is connected to a gas supplying source 66 of the dichlorosilane gas thorough a valve 63, a flow-rate adjusting part 64, and a valve 65. Furthermore, bypass ways 8a and 8b branched out from between the valve 4a and the flow-rate adjusting part 43 of the gas tube 4, which serve as assistant replacement-gas ways, are respectively connected to the gas tubes 5 and 6. Accordingly, the nitrogen gas may be introduced from the nitrogen gas supplying source 4b to the gas tubes 5 and 6.

A tip of the bypass way 8a is connected to a point P2 between the flow-rate adjusting part 54 and the valve 55 of the gas tube 5. A tip of the bypass way 8b is connected to a point P3 between the flow-rate adjusting part 64 and the valve 65 of the gas tube 6. Additionally, a valve 81 which corresponds to a third open-close unit is provided in the bypass way 8a. Additionally, a valve 82 which corresponds to a third open-close unit is also provided in the bypass way 8b. These bypass ways 8a and 8b are both to replace the process gas remaining in the gas tubes 5, 6 with the nitrogen gas, for example after the thermal process is completed and the valves 55, 65 are closed.

Next, an operation by the aforementioned unit will be described, taking a case as an example, in which a silicon nitride film is formed. For example, 150 sheets of wafers W are placed on the wafer-boat 27 in a tier-like manner. This wafer-boat 27 is conveyed by the boat-elevator 26 into the inner tube 22 from the opening portion provided at the lower part of the manifold 24. This opening portion is hermetically closed by the lid 28. Next, the inside of the reaction tube 21 is heated by the heater 29 to be, for example, about 760 C°. Then, a pressure in the reaction tube 21 is adjusted to be, for example, $133 \times 10^{-1}$ Pa ($1.0 \times 10^{-1}$ Torr) by adjusting a discharging (exhaust) volume. On the other hand, the ammonium gas and the dichlorosilane gas, which are process gases, are respectively supplied through the gas tube 5 and the gas tube 6, so that a film-forming process is carried out on the wafers W.

Figure 5:
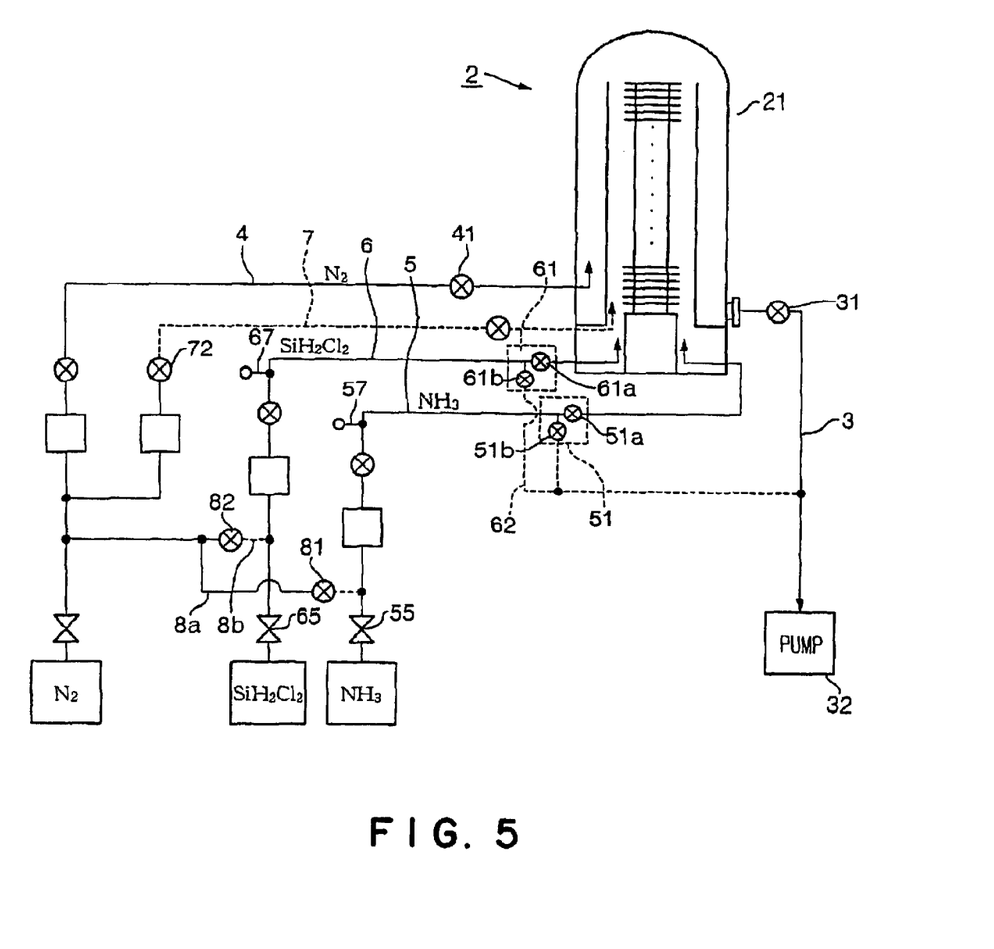
FIG. 5 is an illustrative view for illustrating an operation of the thermal processing unit in FIG. 1.

A gas flow in the film-forming process is shown in FIG. 5. In FIG. 5, a flowing state is indicated with a solid line and a non-flowing state is indicated with a dotted line. As shown in FIG. 5, the process gases flow in the gas tubes 5 and 6. In addition, as described above, the nitrogen gas flows in the gas tube 4 in order to prevent reaction products generated by a reaction of the process gases from adhering to an inner wall of the outer tube 23. On the other hand, the nitrogen gas does not flow in the gas tube 7 as shown in FIG. 5 because the valve 72 is closed. Furthermore, the nitrogen gas also does not flow at downstream portions of the respective valves 81, 82 of the bypass ways 8a and 8b because the valves 81 and 82 are also closed. Moreover, the valves 51b, 61b on the side of the bypass ways in the valve units 51, 61 are closed during the film-forming process for both of the gas tubes 5, 6, in which the gas flows. Accordingly, a sucking force of the vacuum pump 32 reaches only the side of the reaction tube 21. At that time, the controlling part 100 controls the pressure-adjusting unit 31 in order to maintain the pressure in the reaction container 2 at the aforementioned processing pressure of, for example, $133 \times 10^{-1}$ Pa ($1.0 \times 10^{-1}$ Torr).

Figure 6:
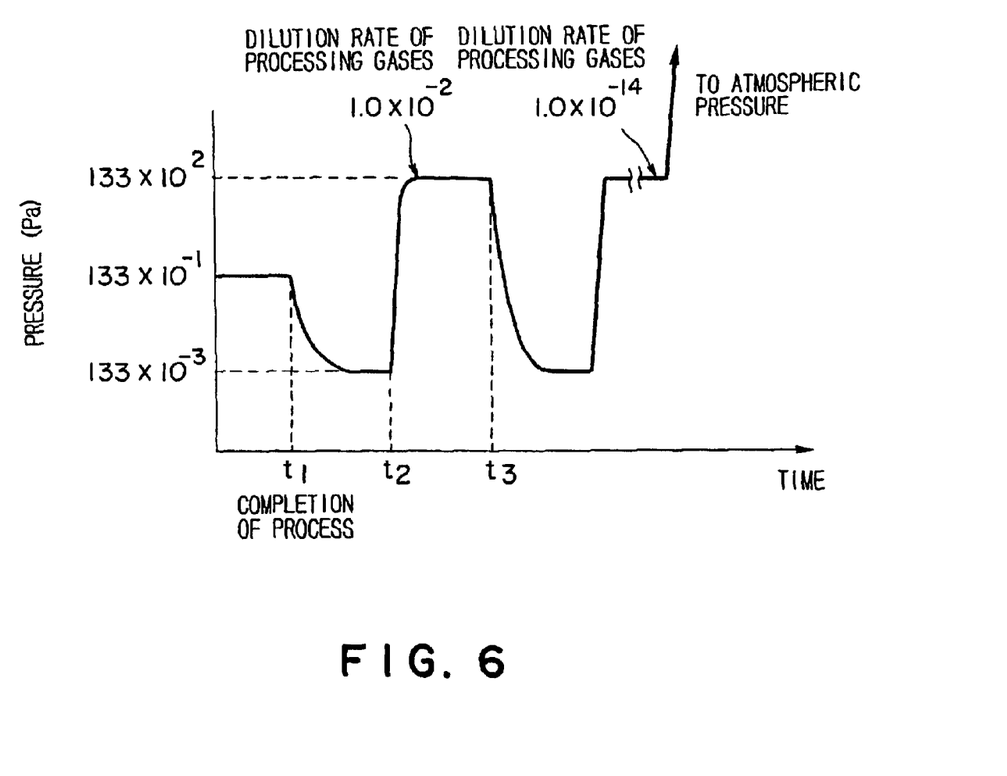
FIG. 6 is a specific chart for illustrating a process to discharge a process gas from the reaction container in the thermal processing unit in FIG. 1.

Next, a step to discharge the process gases remaining in the reaction container 2 and in the gas tubes 5 and 6 after the completion of the film-forming process is explained with reference to FIG. 6 to 8. FIG. 6 is a specific chart showing a pressure change in the reaction container 2 as time passes and a concentration of the remaining process gases (dilution ratio) as well. As shown in FIG. 6, when the film-forming process is completed at the time t1, the valves 55 and 65 are closed so that flow of the process gases into the gas tubes 5, 6 is stopped. In addition, the valves 51a and 61a are closed, and the pressure-adjusting unit 31 are fully opened (refer to FIG. 7). Thereby, the inside of the reaction container 2 is quickly shifted to a pressure-reduced state. At that time, the pressure inside the reaction container 2 is maintained to be, for example, $133 \times 10^{-3}$ Pa ($1.0 \times 10^{-3}$ Torr).

Next, at the time t2, the pressure-adjusting unit 31 is once closed and the valve 71 is opened, so that the nitrogen gas introduction from the gas tube 7 is started. Thereafter, while the process gas(es) remaining in the reaction container 2 is replaced with the replacement gas (the discharge from the reaction container 2 is continued), the pressure in the reaction container 2 is raised to be not less than the pressure at the film-forming process. This pressure-raising step is carried out aiming that the pressure in the reaction container 2 is raised by introducing the nitrogen gas into the reaction container 2 so that a probability of collision between remaining process gas molecules and nitrogen gas molecules is enhanced. This allows more process gases to be discharged during a pressure-lowering step which is carried out later. In the pressure-raising step, the nitrogen gas from the gas tube 7 flows into the reaction container 2 at a blast. Here, if the silica porous layer 9 is provided at a gas outlet of the gas tube 7, the nitrogen gas diffuses uniformly and is introduced at a large flow rate without stirring up particles in the reaction container 2. The inside pressure of the reaction container 2 is raised to, for example, $133 \times 10^2$ Pa, and a dilution ratio of the process gases is, for example, $1.0 \times 10^{-2}$.

After the aforementioned pressure-raised state is maintained for a time during which enough amount of the nitrogen gas to replace the process gas(es) is introduced, for example, for about 5 minutes, the pressure-adjusting unit 31 is unfastened at the time t3. Thereby, the inside pressure of the reaction container 2 is lowered to, for example, $133 \times 10^{-3}$ Pa, which is the same as the pressure in the first pressure-lowering step carried out previously. Accordingly, the process gas(es) is discharged together with the nitrogen gas. By repeating such a pressure-raising/lowering steps, the dilution ratio of the process gas(es) in the reaction container 2 is lowered to be not more than a safety dilution ratio which permits the reaction container 2 to be opened, for example, to be about $1.0 \times 10^{-14}$. Thereafter, the nitrogen gas is introduced from the gas tube 7 to the reaction container 2 with the pressure-adjusting unit 31 being closed, so that the inside of the reaction container 2 is caused back to be at the atmospheric pressure. Thereafter, the wafer-boat 27 is lowered. Incidentally, a time to maintain this pressure-reduced (lowered) state is, for example, about 5 minutes.

After the dilution ratio of the process gases remaining in the reaction container 2 is lowered to be not more than the safety dilution ratio, for example, $1.0 \times 10^{-14}$, and when the inside of the reaction container 2 starts to be caused to get back to the atmospheric pressure, an operation to replace with the nitrogen gas the process gases remaining in the gas tubes 5, 6 for supplying the process gases is started in parallel to that. In other words, in the reaction container 2, for example while the wafer-boat 27 is lowered and/or the wafers W are conveyed out from the wafer-boat 27, the replacement process of the process gases in the gas tubes 5, 6 is carried out concurrently.

Figure 7:
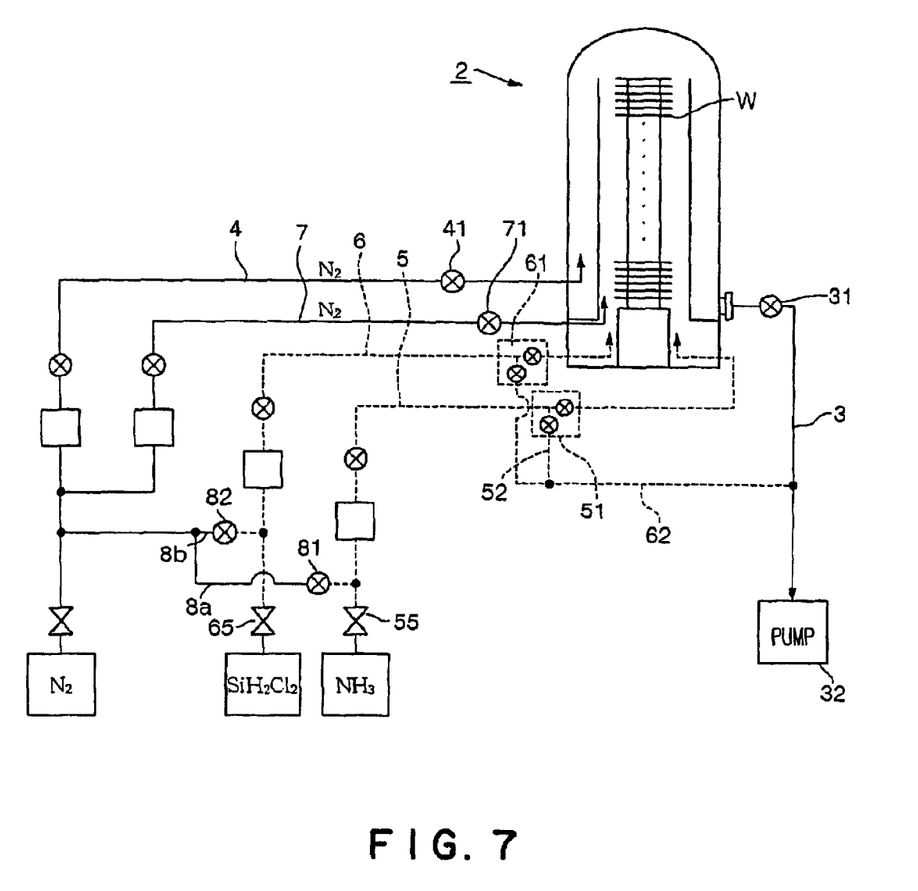
FIG. 7 is an illustrative view for illustrating an operation of the thermal processing unit in FIG. 1.
Figure 8:
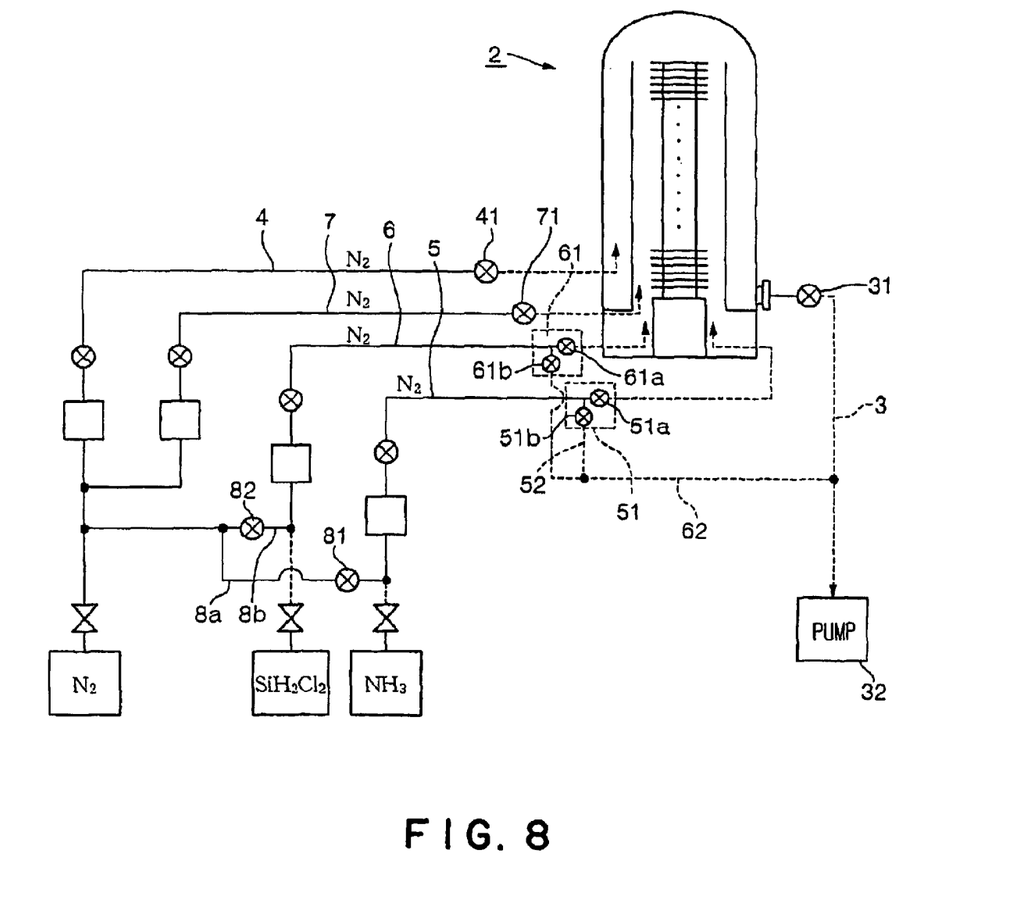
FIG. 8 is an illustrative view for illustrating an operation of the thermal processing unit in FIG. 1.

Specifically, as shown in FIG. 8, the valve 71 is closed from the state shown in FIG. 7, and the supply of the nitrogen gas to the reaction container 2 is stopped. On the other hand, the valve 81 and the valve 82 are opened, and the nitrogen gas is introduced from the bypass ways 8a, 8b to the gas tubes 5, 6. At that time, the valves 51a, 51b and the valves 61a, 61b are both closed in the valve units 51, 61, and the bypass ways 52, 62 and the gas tubes 5, 6 are not connected (communicated) therebetween. Therefore, pressures in the gas tube 5 and in the gas tube 6 are raised at a blast by the pressure of the nitrogen gas supplied from the upstream side. Then, when the pressures inside the tubes are raised to be, for example, 2 atmosphere, the valves 51b, 61b are opened, so that the gas tubes 5, 6 and the bypass ways 52, 62 are communicated with each other. Thereby, the process gases remaining in the tubes are flown out to the discharging tube 3 together with the nitrogen gas. This pressure-raising/lowering steps in the gas tubes 5, 6, in which the pressure-raising operation by the introduction of the nitrogen gas and the discharging operation are repeated, are to be repeated until the concentration of the process gases is lowered to be a certain value.

According to the above-described embodiment, the valves 51a, 61a that are the first open-close units are provided respectively, in the vicinities of the reaction container 2 of the gas tubes 5, 6 for supplying the process gases. Therefore, a room, from which the process gases therein should be discharged, is separated after the completion of the film-forming process, the inside of the reaction container 2 is firstly caused to be in the pressure-reduced state, then the nitrogen gas is introduced from the gas tube 7 into the reaction container 2 so that the inside of the reaction container 2 is caused to be at a pressure higher than that during the thermal process, and thereafter the inside of the reaction container 2 is again caused to be in the pressure-reduced state. This enables the gas replacement process in the reaction container 2 to be completed within a short time, so that it is possible to immediately proceed to a step for conveying out the wafers W. A time for making the concentration of the process gases in the reaction container not more than the safety standard value after the completion of the thermal process is about 25 minutes in a sequence using the unit shown in FIG. 9 described in the prior art, but about 15 minutes in a sequence in this embodiment.

Furthermore, according to this embodiment, the gas replacement process in the gas tubes 5, 6, which are the process gas ways, is carried out while the wafers W are transferred. Therefore, the time of the gas replacement process in the gas tubes 5, 6 does not influence the throughput. Incidentally, it is useful to remove the gases remaining in the gas tubes 5, 6 for carrying out a next thermal process excellently.

Moreover, as for the gas replacement process of the separated process-gas way, a large amount of the replacement gas is introduced into an area to be gas-replaced so that the pressure in the area is raised, the probability of molecular collision among the process gases and the nitrogen gas within a short time is enhanced, and thereafter this pressure-raised state is shifted to the pressure-lowered state quickly. Accordingly, it is possible to complete the replacement of the process gas within a shorter time compared with a usual evacuating case. Furthermore, it is possible to significantly enhance the effect by repeating such pressure-raising/lowering steps.

Furthermore, a step may be carried out, in which evacuation is firstly carried out with the valves 51a, 61a being opened after the thermal process, then the valves 51a, 61a are closed and the replacement gas is introduced into the reaction container 2 so that the pressure is raised higher than at the thermal process.

Note that the double tube structure is used for the reaction container 2 in the above embodiment, but the present invention is also applicable to a unit using a reaction container composed of, for example, a single tube.

What is claimed is:

1. A thermal processing unit comprising:
    a reaction container which an object to be processed is conveyed into and from,
    a process-gas introducing part for introducing a process gas into the reaction container,
    a replacement-gas introducing part for introducing a replacement gas into the reaction container, the replacement-gas introducing part being independent of the process-gas introducing part,
    a discharging part for discharging a gas in the reaction container, and
    a controlling part connected to the process-gas introducing part, the replacement-gas introducing part and the discharging part, the controlling part being adapted to: control the discharging part so as to lower a pressure in the reaction container with respect to at a thermal process; then control the process-gas introducing part and the replacement-gas introducing part so as to stop introducing the process gas and introduce the replacement gas into the reaction container as well as control the discharging part so as to raise the pressure in the reaction container with respect to at the thermal process; and then control the discharging part so as to lower the pressure in the reaction container with respect to at the thermal process.

2. A thermal processing unit according to claim 1, wherein the process-gas introducing part has
    a process-gas way for introducing the process gas into the reaction container and
    a first open-close unit arranged in a vicinity of the reaction container, the first open-close unit opening and closing the process-gas way, and
    the controlling part is adapted to control the first open-close unit.

3. A thermal processing unit according to claim 2, wherein the discharging part has a discharging way for discharging the gas in the reaction container and a pressure-adjusting unit arranged in the discharging way, the pressure-adjusting unit adjusting to open and close the discharging way so as to adjust the pressure in the reaction container, and the controlling part is adapted to control the pressure-adjusting unit.

4. A thermal processing unit according to claim 3, further comprising a bypass way connected between an upstream portion with respect to the first open-close unit in the process-gas way and the discharging way, the bypass way bypassing the reaction container, and a second open-close unit that opens and closes the bypass way.

5. A thermal processing unit according to claim 4, wherein an assistant replacement-gas introducing part for introducing the replacement gas into the processing-gas way is provided at an upstream portion with respect to a position connecting to the bypass way in the process-gas way.

6. A thermal processing unit according to claim 5, wherein the assistant replacement-gas introducing part has an assistant replacement-gas way for introducing the replacement gas into the process-gas way and a third open-close unit that opens and closes the assistant replacement-gas way.

7. A thermal processing unit according to claim 6, wherein the controlling part is connected to the second open-close unit and the third open-close unit, is adapted to control the first open-close unit and the third open-close unit to stop introducing the process gas and to introduce the replacement gas into the process-gas way so as to generate a pressure-raised state in the process-gas way, and then is adapted to control the second open-close unit so as to discharge the gas in the process-gas way through the bypass way.

8. A thermal processing method for conducting a thermal process to an object to be processed by using a thermal processing unit comprising:

a reaction container which an object to be processed is conveyed into and from, a process-gas introducing part for introducing a process gas into the reaction container, a replacement-gas introducing part for introducing a replacement gas into the reaction container, the replacement-gas introducing part being independent of the process-gas introducing part, and a discharging part for discharging a gas in the reaction container, the method comprising:

a first pressure-lowering step of controlling the discharging part so as to lower a pressure in the reaction container with respect to at the thermal process, the first pressure-lowering step being conducted after completing the thermal process, a pressure-raising step of controlling the process-gas introducing part and the replacement-gas introducing part so as to stop introducing the process gas and introduce the replacement gas into the reaction container as well as controlling the discharging part so as to raise the pressure in the reaction container with respect to at the thermal process, the pressure-raising step being conducted after the first pressure-lowering step, and a second pressure-lowering step of controlling the discharging part so as to lower the pressure in the reaction container with respect to at the thermal process, the second pressure-lowering step being conducted after the pressure-raising step.

9. A thermal processing method for conducting a thermal process to an object to be processed by using a thermal processing unit comprising:

a reaction container which an object to be processed is conveyed into and from, a process-gas introducing part for introducing a process gas into the reaction container, a replacement-gas introducing part for introducing a replacement gas into the reaction container, the replacement-gas introducing part being independent of the process-gas introducing part, and a discharging part for discharging a gas in the reaction container, the process-gas introducing part having a process-gas way for introducing the process gas into the reaction container and a first open-close unit arranged in a vicinity of the reaction container, the first open-close unit opening and closing the process-gas way, the controlling part being adapted to control the first open-close unit, the discharging part having a discharging way for discharging the gas in the reaction container and a pressure-adjusting unit arranged in the discharging way, the pressure-adjusting unit adjusting to open and close the discharging way so as to adjust the pressure in the reaction container, the controlling part being adapted to control the pressure-adjusting unit, the thermal processing unit further comprising a bypass way connected between an upstream portion with respect to the first open-close unit in the process-gas way and the discharging way, the bypass way bypassing the reaction container, and a second open-close unit that opens and closes the bypass way, an assistant replacement-gas introducing part for introducing the replacement gas into the processing-gas way being provided at an upstream portion with respect to a position connecting to the bypass way in the process-gas way, and the assistant replacement-gas introducing part having an assistant replacement-gas way for introducing the replacement gas into the process-gas way and a third open-close unit that opens and closes the assistant replacement-gas way, the method comprising:

a pressure-raising step of controlling the first open-close unit and the third open-close unit so as to stop introducing the process gas and introduce the replacement gas into the process-gas way so as to generate a pressure-raised state in the process-gas way, and a step of controlling the second open-close unit to discharge the gas in the process-gas way through the bypass way, the step being conducted after the pressure-raising step.

* * * * *